United States Patent [19]

Ohta et al.

[11] Patent Number: 5,148,214
[45] Date of Patent: Sep. 15, 1992

[54] ALIGNMENT AND EXPOSURE APPARATUS

[75] Inventors: Masakatsu Ohta, Yokohama; Hideki Ina, Kawasaki; Akiyoshi Suzuki, Tokyo, all of Japan

[73] Assignee: Canon Kabushiki Kaisha, Tokyo, Japan

[21] Appl. No.: 759,953

[22] Filed: Sep. 17, 1991

Related U.S. Application Data

[63] Continuation of Ser. No. 577,077, Sep. 4, 1990, abandoned, which is a continuation of Ser. No. 453,175, Dec. 26, 1989, abandoned, which is a continuation of Ser. No. 284,857, Dec. 13, 1988, abandoned, which is a continuation of Ser. No. 46,466, May 6, 1987, abandoned.

[30] Foreign Application Priority Data

May 9, 1986 [JP] Japan ................................. 61-104841

[51] Int. Cl.$^5$ ...................... G03B 27/42; G03B 27/70
[52] U.S. Cl. ........................................ 355/43; 355/53; 355/77
[58] Field of Search .................... 355/43–45, 355/53, 77; 356/400, 401

[56] References Cited

U.S. PATENT DOCUMENTS

| | | | |
|---|---|---|---|
| 4,573,791 | 3/1986 | Phillips | 355/53 X |
| 4,641,035 | 2/1987 | Suzuki et al. | 356/400 X |
| 4,685,807 | 8/1987 | Picard | 356/401 |
| 4,741,622 | 5/1988 | Suwa et al. | 356/401 |
| 4,752,668 | 6/1988 | Rosenfield et al. | 219/121.68 |

FOREIGN PATENT DOCUMENTS 61-73329  4/1986  Japan.
61-114529 10/1986  Japan.

OTHER PUBLICATIONS

Photo–etching of PMMA by Excimer Laser Irradiation by Kawamura et al., The Institute of Physical and Chemical Research Waho-shi, Saitama pp. 69–71, Nov. 6, 1980.
"Photoablation of Resist Coated Alignment Targets to Improve VLSI Pattern Overlay", vol. 774 Lasers in Microlithography (1987) Lithography Trends; Semiconductor International, vol. 23 (Dec. 1986).
Nikkei Microdevices, Feb. 1987 issue, pp. 113–124.

Primary Examiner—L. T. Hix
Assistant Examiner—Rutledge, D.
Attorney, Agent, or Firm—Fitzpatrick, Cella, Harper & Scinto

[57] ABSTRACT

A mark detecting device usable in an alignment and exposure apparatus for aligning an alignment mark of a mask with an alignment mark of a wafer and for exposing a resist layer provided on the surface of the wafer to a pattern of the mask with radiation. The device includes a system for detecting light from the wafer, the detecting system including a photodetecting device for detecting light and a wavelength selecting element disposed in a path of light from the wafer to the photodetecting device so as to allow introduction of light of a predetermined wavelength into the light path from outside the light path to illuminate the wafer, and a portion for forming a photoprint of the alignment mark of the mask in the resist layer provided on the surface of the wafer, the photoprint forming portion being arranged, for the formation of the photoprint, to direct, to the wafer, the light of the predetermined wavelength from the outside of the light path and by way of the mask and the wavelength selecting element, wherein the photodetecting device is effective to detect the light from the wafer to detect the alignment mark of the wafer and the photoprint of the alignment mark of the mask.

34 Claims, 7 Drawing Sheets

ALIGNMENT AND EXPOSURE APPARATUS

This application is a continuation of application Ser. No. 07/577,077 filed Sept.. 4, 1990, now abandoned; which is a continuation of application Ser. No. 07/453,175 filed Dec. 26, 1989, now abandoned; which is a continuation of application Ser. No. 07/284,857 filed Dec. 13, 1988, now abandoned; which is a continuation of application Ser. No. 07/046,466 filed May 6, 1987, now abandoned.

FIELD OF THE INVENTION AND RELATED ART

This invention relates generally to an alignment and exposure apparatus for use in a photolithographic process which is one of manufacturing processes for semiconductor devices such as integrated circuits (ICs), large scaled integrated circuits (LSIs), etc. More particularly, the invention is concerned with a projection type exposure apparatus having a projection optical system for projecting a pattern of a reticle onto a semiconductor wafer, and an alignment system usable for aligning the reticle pattern and a pattern previously photoprinted on the wafer.

Resolution and alignment accuracy are basic performances required in alignment and exposure apparatuses used in the field of manufacture of semiconductor devices. Also, throughput (processing ability) will be an essential performance in the point that the alignment and exposure apparatuses are productive machines. The tendency of further miniaturization and higher capacity of semiconductor devices has enforced further improvements in the resolution and alignment accuracy. Depending on an exposure process adopted, the alignment and exposure apparatuses are classified into a contact exposure type, a proximity exposure type, a 1:1 mirror projection exposure type, a lens projection exposure type, etc. Reduction lens projection type exposure apparatuses (called "steppers") have become prevailing because of their capabilities of transferring more fine circuit patterns. Since advantages in the reduction lens projection type exposure systems in respect to the resolution have already been fully discussed in various printed publications, description thereof will be omitted here. However, examination made by Applicants of such lens projection type exposure systems has revealed that there still remain serious problems in respect to the alignment accuracy. That is, many lens projection type exposure systems employ such an alignment system which uses a light beam having a wavelength other than that of a light beam used for the exposure of a semiconductor wafer. To the contrary, the projection lens is usually designed such that the imaging performances and correction of aberration are assured only with respect to one particular wavelength which is, usually, that of the exposure light.

In view of the above, various measures have been proposed and taken to overcome the problems caused by using different wavelengths. However, it has been found that these measures themselves cause additional errors in relation to the alignment accuracy.

These errors are:

(A) An error due to the intervention of an intermediate reference or references, with respect to which alignment marks of a reticle (or mask) and a wafer are aligned to indirectly bring them into alignment with each other;

(B) An error due to an insufficient accuracy in the displacement of the wafer and/or the reticle during a time period from the alignment to the exposure;

(C) An error with respect to the displacement caused by any change in temperature of the components, vibration or the like during the time period from the alignment to the exposure;

(D) An error due to any difference in the optical path length with respect to the light beams used for the alignment and the exposure, respectively; etc.

While it is possible to suppress these errors to some degree, it is not easy to stably maintain these errors at minimum levels.

U.S. Pat. No. 4,521,082, corresponding to Japanese Laid-Open Patent Application, Laid-Open No. 25638/1983, assigned to the same assignee of the subject application discloses an improved alignment and exposure system in which a light source for the alignment comprises an He-Cd laser providing a wavelength of 442 nm which is very close to the wavelength of exposure light (e.g. the g-line having a wavelength of 436 nm), and in which a projection lens is designed so that the aberrations are corrected with respect to these two wavelengths. With such arrangement, the above-described errors (A)–(D) can be obviated.

However, there still remains a problem such as follows:

As is known in the art, it is desired to suppress a standing-wave effect which occurs in a photoresist material applied to the wafer, in order to effectively utilize the resolving power of the projection lens. For this purpose, it has been proposed to subject the wafer surface to an anti-reflection treatment or to add a light-absorbing agent to the resist material. As a further alternative, it has been proposed to use a multi-layer structure for the resist layer. Such techniques will become more and more important in view of recent trends of further miniaturization and higher capacities of the semiconductor devices. If these processes are adopted, it may not be so easy to obtain signals from the wafer during the alignment operation using a wavelength equal to or close to that used for the exposure.

As a solution for these problems, a proposal has been made in Japanese Laid-Open Patent Application, Laid-Open No. 114529/1986 filed in the name of the assignee of the subject application. This Japanese Patent Application discloses a unique and improved alignment and exposure method and apparatus which is effective to suppress various errors peculiar to conventional alignment systems such as described in the foregoing and which can meet with the use of a light-absorptive resist material or a multi-layer resist layer.

The principle of alignment disclosed in this Japanese application is applicable not only to ordinary lens projection type exposure systems but also to lens projection type exposure systems and mirror projection type exposure systems using shorter wavelengths, as well as X-ray exposure apparatuses.

Briefly, according to the proposal made in this Japanese application, there is provided an alignment and exposure method and apparatus for aligning a pattern of a mask or reticle with a pattern of a wafer and for transferring the pattern of the mask onto a resist layer formed on the surface of the wafer, wherein a small portion of the resist layer on the wafer in the vicinity of an alignment mark formed on the wafer is exposed to light passed through a small portion of the mask including an alignment mark formed on the mask, thereby to form an image of the alignment mark of the mask on the resist layer of the wafer, the image of the alignment mark of the mask formed on the resist layer of the wafer and the alignment mark formed on the wafer being detected so as to detect any positional deviation between the image and the alignment mark formed on the wafer, at least one of the mask and the wafer being displaced on the basis of the result of detection, and finally the resist layer of the wafer being exposed to light passed through a portion of the mask including the pattern.

In summary, according to the proposed alignment principle, any local change in the resist layer resulting from the exposure is detected as a signal related to the mask.

More specifically, when the resist material is irradiated with light, there occurs an opto-chemical reaction in the resist material. Also, in respect to an optical phenomenon, the irradiation causes changes in the transmission factor and in the refractive index of the resist material. Depending on the kind of the resist material used, it also causes expansion or contraction of the resist material which results in formation of a stepped portion at the boundary between the irradiated area and the non-irradiated area. For an ordinarily used OFPR resist or AZ resist material, for example, the result of such selective exposure or irradiation can be observed through a microscope and under a white light, as an image defined by the difference in brightness when viewed. More particularly, when the resist material is selectively or partially exposed to light, the transmission factor of the exposed portion of the resist material increases as the result of exposure. Therefore, the exposed area of the resist material can be observed as a bright area as compared with the non-exposed area, even if the resist material is not yet subjected to a "developing" process. Thus, an image is observable on the resist material after the selective exposure and before the development. Hereinafter, such image formed only by the exposure (i.e. without development) will conveniently be referred to as a "latent image".

The proposed alignment method uses such "latent image" for the sake of the alignment between the reticle (or mask) and the wafer.

That is, when any latent image of a reticle is just formed on a resist layer of a wafer by means of an exposure optical system, the thus formed latent image does not contain any error in relation to the reticle. In other words, the latent image formed by the exposure optical system bears exact positional information with respect to the reticle by way of the exposure optical system. It follows therefrom that, if any positional deviation between the latent image formed on the resist layer and a reference preparatively formed on the substrate of the wafer is detected, the positional relation between the reticle and the wafer by way of the exposure optical system can be very exactly detected. According to the proposed alignment method, in view of the above, a latent image of an alignment mark of a reticle is formed on a resist layer of a wafer, preferably at a position in close vicinity of an alignment mark preparatively formed on the substrate of the wafer, and the positional deviation between the latent image thus formed on the resist layer and the alignment mark of the wafer is detected to thereby detect the positional relation between the reticle and the wafer. This assures extraordinarily accurate and stable detection of the positional relation between the reticle and the wafer, without being affected by the exposure optical system, since the detection of the positional deviation between the latent image and the alignment mark of the wafer is exactly equivalent to detection of the positional relation between two juxtaposed images formed on the same object.

FIG. 6A of the accompanying drawings shows an alignment and exposure apparatus arranged in accordance with the proposed principle.

As shown in FIG. 6A, the main assembly of the exposure apparatus is carried by a surface plate 1. Disposed on the surface plate 1 is a wafer stage 2 which supports a wafer holder 3 and a wafer 4 held on the holder 3 by vacuum suction or the like. The stage 2 supports the holder 3 and the wafer 4 for movement in a plane perpendicular to an optical axis of a projection lens system 5, by means of a drive unit (not shown) of known type. The wafer stage 2 has formed thereon a mirror 6 on which a beam 7 from an unshown laser interferometer is incident, whereby the position of the wafer stage 2 can be detected in a known manner and whereby the movement of the wafer stage 2 can be controlled also in a known manner. Located above the projection lens system 5 is a reticle 9 held by a reticle holder 8. The holder 8 is movable in a plane perpendicular to the optical axis of the projection lens system 5 by means of a drive unit (not shown) of known type. Disposed above the reticle 9 is an illumination optical system generally denoted at reference A. When a light beam is supplied to the reticle 9 from the illumination optical system A, a pattern formed on the reticle 9 is transferred by means of the projection lens system 5 onto the surface of the wafer 4.

The illumination optical system A comprises a light source 10 such as a super Hg lamp, first to third condenser lenses 11-13 provided to uniformly illuminate the surface of the reticle 9 with a light supplied by the light source 10, first and second mirrors 14 and 15 provided to bend or deflect the light beam, and a shutter 16 for controlling the exposure.

The second and third condenser lenses 12 and 13 and the second mirror 15 are arranged to cooperate with each other so as to bring a plane B into an optically conjugate relation with a pattern bearing surface 17 of reticle 9. Accordingly, by disposing an appropriate masking member on the plane B, only a desired area of the reticle 9 can be illuminated. Actually, a masking member 18 is disposed on the plane B. As is best seen in FIG. 6B, the masking member 18 includes two masks 19 and 20 which are held by a common frame member. the mask 19 is provided for the sake of selective exposure of only a circuit pattern area of the reticle 9, while the mask 20 is provided for the sake of selective exposure of only alignment mark areas of the reticle 9, as will be described later. An actuator 21 (FIG. 6A) such as a combination of a cylinder and a plunger is coupled to the masking member 18 to move the masking member 18 along the plane B, so that the masks 19 and 20 are interchangeably disposed in the path of the flux of light reflected from the first mirror 14.

FIG. 6B shows details of the masking member 18 adapted to be used with the reticle 9 of FIG. 6A, for the sake of selective exposure thereof. As described hereinbefore, the masking member 18 includes the mask 19 which is arranged for the sake of exposure of only the circuit pattern area of the reticle 9, and the mask 20 which is arranged for the sake of selective exposure of only small portions of the reticle 9 including alignment marks. As shown in FIG. 6B, the mask 19 has a light-transmitting area of square shape, corresponding to the circuit pattern area of the reticle 9, and a light-blocking area defined at the peripheral portion of the light-transmitting area. On the other hand, the mask 20 has two small light-transmitting areas 38 (which hereinafter "windows") each having a square shape as illustrated. The remaining area of the mask 20 forms a light-blocking portion. The windows 38 are disposed so that, when the mask 20 is introduced into the optical path such as shown in FIG. 6A, these windows 38 are imaged on small portions of the surface of the reticle 9 including the alignment marks of the reticle, respectively. Also, the shape and size of each of the windows 38 are selected to assure that the light beam passed therethrough is incident on the portion of the reticle 9 surface fully including the whole of an associated one of the alignment marks of the reticle 9. Each of the masks 19 and 20 may be formed by selectively coating a transparent glass substrate with a chromium material for the sake of selective interception of the light, at the reticle 9.

The alignment and exposure apparatus further includes an alignment optical system generally denoted at reference C in FIG. 6A. As shown in this Figure, the alignment optical system C is disposed in such a manner that a portion thereof is inserted into a space between the projection lens system 5 and the wafer 4. The alignment optical system C includes a light source 22 such as a halogen lamp. The light beam emitted from the light source 22 is condensed by a condensing mirror 23 and a condenser lens 24 and, after passing through a half prism 25 and an objective lens 26, is incident on a movable mirror 27. The mirror 27 is movable between a solid line position and a broken line position. At the broken line position, the mirror 27 is inclined at an angle of 45 degrees with respect to the optical axis of the projection lens system 5. At this position, the mirror 27 is effective to reflect the light beam incident thereon toward the wafer 4 surface to illuminate it. The light beam incident on the wafer 4 surface is reflected thereby and the reflected light beam is directed to the half prism 25 by way of the movable mirror 27 and the objective lens 26. The light beam incident on the half prism 25 is reflected upwardly by the prism 25, so the light beam after passing through a relay lens 28 is focused on a surface 30 of an image pickup tube 29. By this, an image of a portion of the wafer 4 is formed on the image pickup surface 30.

Preferably, the light source 22 produces a light beam to which a photoresist material applied to the wafer 4 surface is not sensitive. If a light beam produced by any light source used contains such component to which the photoresist material used is sensitive, a filter may be used to intercept the sensitizing component.

While only one portion of the alignment optical system C is illustrated in FIG. 6A, the alignment and exposure apparatus of this example actually includes two sets of alignment optical systems so as to detect the positional relation between the reticle 9 and the wafer 4 at two points. The two-point detection is preferable because it allows ready and accurate alignment between the reticle 9 and the wafer 4 in X, Y and θ axes which are three orthogonal directions, only by displacement of at least one of the reticle 9 and the wafer 4 in a plane perpendicular to the optical axis of the projection lens system 5.

For the formation of latent images of the reticle alignment marks on the resist layer which is provided on the wafer 4 surface, the shutter 16 is actuated to allow passage of the light beam to the reticle 9. At this time, the mask 20 for the selective exposure of the alignment marks of the reticle 9 has already been initially set at the position shown in FIG. 6A. Therefore, only small portions of the reticle 9 containing the alignment marks are irradiated with the light beams passed through the windows 38 of the mask 20 shown in FIG. 6B. The light beams passed through the alignment mark portions of the reticle 9 are projected upon the wafer 4 by the projection lens system 5. In other words, portions of the wafer 4 surface are exposed to the light beams passed through the alignment mark portions of the reticle 9. By this, latent images of the reticle alignment marks are formed on or in the resist layer of the wafer 4 at positions close to the wafer alignment marks, respectively.

Each of the thus formed latent images is an image of one reticle alignment mark as projected upon the resist layer provided on the wafer. Thus, the latent image bears exact positional information concerning the "position" of the reticle alignment mark as being projected upon the wafer. Accordingly, by relatively moving the reticle and the wafer so as to relatively align the latent images of the reticle alignment marks with corresponding wafer alignment marks, high-accuracy alignment of the reticle and the wafer substantially free from such alignment errors as described hereinbefore is attainable.

However, some problems are still involved in the arrangement having been described with reference to FIGS. 6A and 6B. These problems are as follows:

(1) It is necessary to define a masking plane (plane B) in the illumination optical system, which necessitates use of a high-precision imaging optical system.

(2) It is necessary to change the masking members (masks 19 and 20) quickly and accurately to change the operation mode from "alignment" to "exposure" or vice versa. This necessitates use of a mask changing mechanism having a high positioning accuracy. Also, it causes an additional problem (2') that the mask changing movement leads to a possibility of creation of dust or foreign particles.

(3) Use of a movable mirror between the projection lens system and the wafer leads to the necessity of changing the position of the mirror quickly and accurately at the time of the changeover of the operation mode from the "alignment" to the "exposure" or vice versa. Therefore, use of a position changing mechanism having a high angular-positioning accuracy is necessary. Also, this leads to an additional problem (3') that the position changing movement causes a possibility of creation of dust or foreign particles.

Of these problems, the problems (1) to (3) will result in an increase in the manufacturing cost of the apparatus. On the other hand, the creation of dust or foreign particles, of the problems (2') and (3'), will result in decreased reliability of the apparatus.

SUMMARY OF THE INVENTION

Accordingly, it is a primary object of the present invention to provide an alignment and exposure apparatus which is substantially free from all the problems described hereinbefore.

It is another object of the present invention to assure an improvement in an alignment and exposure apparatus of the type wherein a partial or local change caused in a resist layer as a result of exposure is detected as a signal concerning the reticle position, as described with reference to FIGS. 6A and 6B.

It is a further object of the present invention to provide an improved alignment and exposure apparatus which includes a reduced number of movable components and which can be manufactured at a reduced cost.

In accordance with one preferred form of the present invention as will be described later in detail, there is provided an alignment and exposure apparatus wherein wavelength selecting means is disposed between a projection lens system and a wafer, the wavelength selecting means being adapted to substantially transmit an exposure beam to which a resist material applied to the wafer has sensitivity and also adapted to substantially reflect an alignment beam to which the resist material substantially shows insensitivity. With this arrangement, the necessity of use of a movable mirror as well as the disadvantages, described with reference to the problem (3), can be avoided.

In accordance with another preferred form of the present invention as will be described later in detail, there is provided an alignment and exposure apparatus wherein wavelength selecting means such as just described above is provided between a projection lens system and a wafer and wherein an additional alignment optical system is provided which system is arranged to detect the relative position of the reticle and the wafer by use of the projection lens system and by use of a light having substantially the same wavelength as that of the exposure beam and which system is also arranged to selectively expose a portion of the reticle (e.g. the portion including the alignment mark). This effectively avoids the inconveniences described with reference to the problem (3) and, additionally, the inconveniences described with reference to the problems (1) and (2).

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

For the alignment of a reticle and a wafer, in the present invention, means is provided to suitably form a latent image of an alignment mark of the reticle on or in a photoresist coating of the wafer and, additionally, means is provided to suitably detect the latent image of the reticle alignment mark and an alignment mark provided on the wafer. The formation of the latent image is accomplished radiation energy such as typically a light having a wavelength or wavelength range to which the resist material used is sensitive. By suitably controlling the radiation energy or light quantity impinging upon the photoresist material, an appropriate, i.e. sufficiently observable "latent image" of the reticle alignment mark is formed on or in the resist coating. Since the latent image so formed is an image formed on or in a sensitive material such as the photoresist material, the latent image used in the present invention can be called a "photoprint" of the reticle alignment mark.

Figure 1:
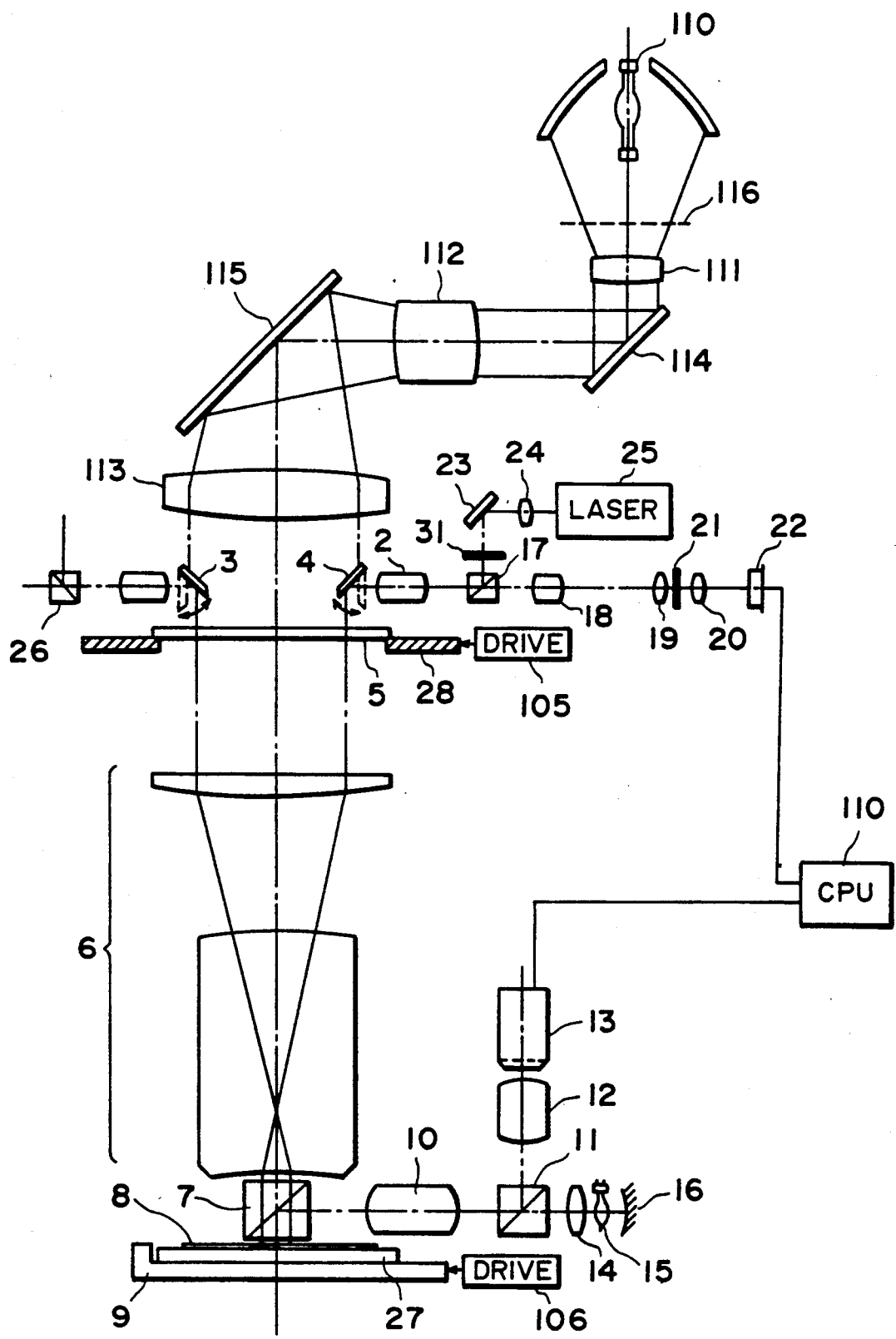
FIG. 1 is a schematic and diagrammatic view of an alignment and exposure apparatus according to an embodiment of the present invention.

Referring now to FIG. 1, there is shown an alignment and exposure apparatus according to an embodiment of the present invention.

In FIG. 1, denoted by numerals 1 and 2 are alignment objective lenses, respectively, adapted to observe alignment marks of a reticle 5 and alignment marks of a wafer 8, at the same time. Plane mirrors 3 and 4 are provided to bend or deflect optical axes of the objective lenses 1 and 2, respectively, downwardly as viewed in FIG. 1. For the exposure (photolithographic transfer of a circuit pattern of the reticle 5), each of the mirrors 3 and 4 is rotationally moved to its broken-line position to prevent shading of an exposure beam. A projection lens system 6 used in this embodiment is of the type that it is telecentric both on the reticle 5 side and the wafer 8 side. A beam splitter 7 is provided between the projection lens system 6 and the wafer 8. The beam splitter 7 is arranged to function merely as a parallel-plane plate with respect to the exposure beam (sensitizing beam) having a wavelength to which a resist material applied to the wafer 8 shows sensitivity. Also, the beam splitter 7 is arranged to function as a mirror or a beam splitting element with respect to an alignment beam having a wavelength or wavelength range to which the resist material substantially shows insensitivity. As for such beam splitter 7, a dichroic prism having a dichroic film which is inclined by 45 degrees relative to the optical axis of the projection lens system 6 and which functions to transmit light having a wavelength range close to the wavelength of the exposure beam and to reflect light having a wavelength range close to the alignment beam, may be used as an example.

Figure 6A:
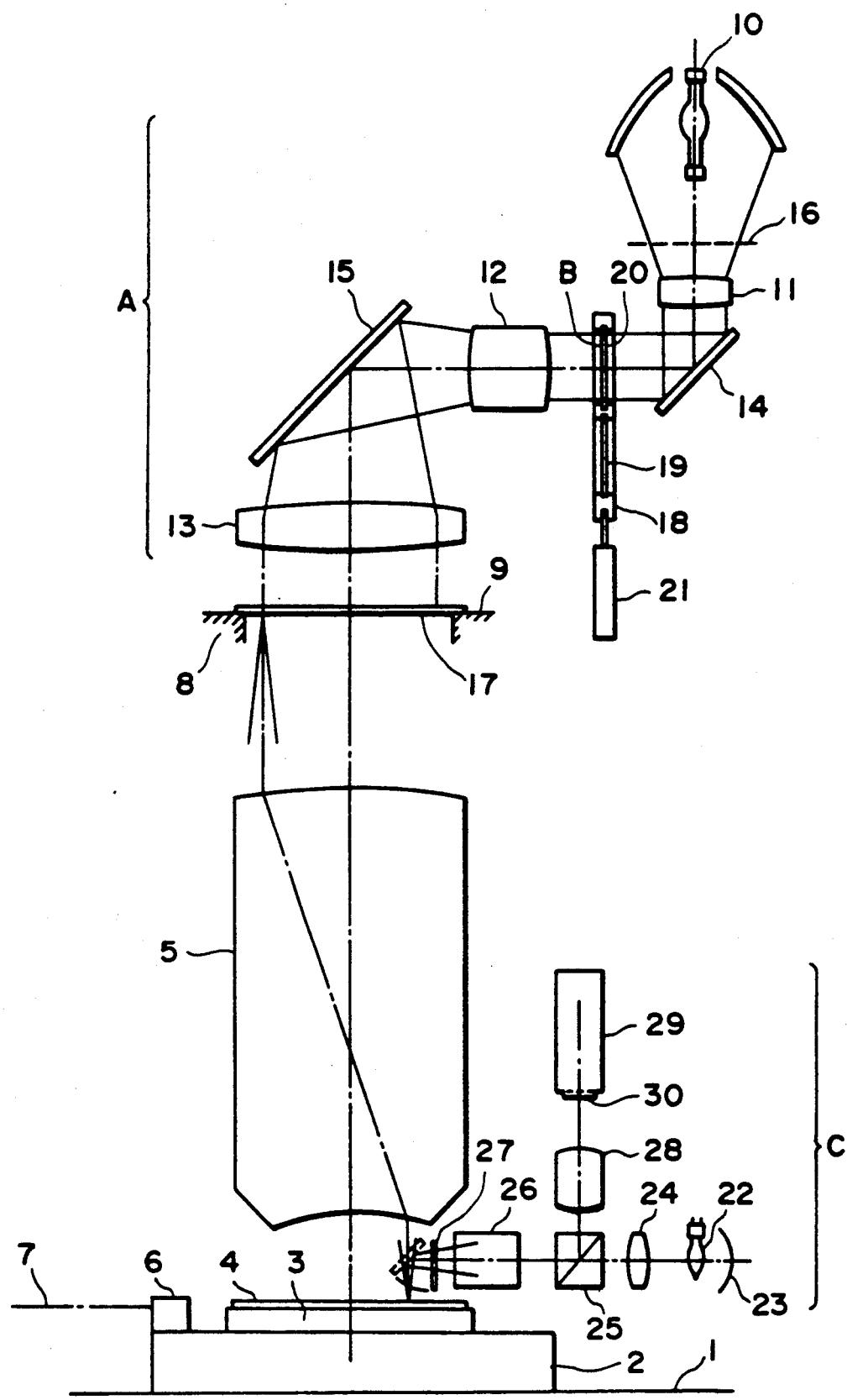
FIG. 6A is a schematic view of an alignment and exposure apparatus of the type disclosed in the aforementioned Japanese Laid-Open Patent Application.
Figure 6B:
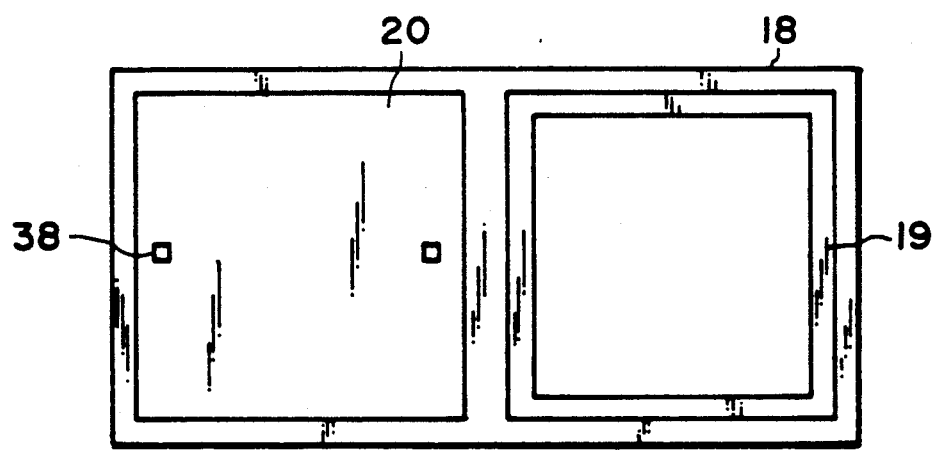
FIG. 6B is a plan view of a masking member used in the apparatus of FIG. 6A, for the selective exposure of a reticle.

The wafer 8 is held by a wafer chuck 27 which is placed on an X-Y-Z stage 9 which is movable in three-dimensional X, Y and Z directions. In this embodiment, the stage 9 can be moved at a high speed and at high precision, so as to align the wafer alignment marks. An objective lens 10 has a relatively wide angle of view and is provided to observe the wafer 8 by use of a white light having a number of different wavelengths. The lens 10 is arranged to observe substantially the whole surface of one shot area of the wafer 8. Denoted in FIG. 1 by numeral 11 is a beam splitter; by 12, an imaging lens; by 13, an image pickup tube; by 14, a collimator lens adapted to collimate the light emitted from a white light source 15; and by 16, a reflector adapted to direct the optical energy from the light source 15 to the collimator lens 14, all of these elements being substantially the same as the corresponding elements included in the arrangement of FIG. 6A.

The apparatus further includes a reticle stage 28 arranged to movably support the reticle 5; a beam splitter 17; a lens optical assembly comprising lenses 18, 19 and 20, for transmitting an image formed by the objective lens 2 to a photosensor 22 comprising an assembly of charge-coupled devices. Hereinafter, the photosensor 22 will be referred to as "CCD photosensor". The lens optical assembly includes a stop 21 disposed between the lenses 19 and 20. The stop 21 comprises a spatial frequency filter provided to filter imagewise information. Use of such filter 21 is particularly effective in a case where the wafer placed on the wafer chuck 27 has a poor "signal-to-noise ratio", such as a wafer having an extraordinarily irregular surface. However, if wafers to be processed have not so irregular surfaces, the filter 21 may be omitted. Denoted by numeral 23 is a flat mirror; by 24, a collimator lens; and by 25, a light source which comprises, in this embodiment, a laser adapted to produce a light of substantially the same wavelength as that used for the "exposure" (the photoprinting of the circuit pattern").

Denoted by numeral 26 is a beam splitter which is of the same type as the beam splitter 17. While not shown in the drawing, the apparatus is provided with, on the left-hand side of the beam splitter 26 as viewed in FIG. 1, optical elements corresponding to those which are disposed on the right-hand side of the beam splitter 17 as viewed in FIG. 1.

A reticle pattern transferring illumination optical system comprises a super Hg lamp 110; first, second and third condenser lenses 111, 112 and 113 which are cooperable with each other to uniformly irradiate the reticle 5 with the light emitted from the lamp 110; first and second mirrors 114 and 115 each are provided to bend or deflect the flux of light. A shutter 116 is provided to control the exposure.

The swingable mirrors 3 and 4 are controllably operated under the influence or control of a central processing unit 110 (hereinafter "CPU"). The alignment mark information as detected by the image pickup tube 13 or the CCD photosensor 22 is supplied to the CPU 110 so that it is subjected to the image processing, whereby positional information is obtained. In accordance with the thus obtained positional information, the CPU 110 produces control signals and supplies them to a driver 105 and/or a driver 106 so as to controllably move the reticle stage 28 and/or the wafer stage 9 for alignment purpose.

The optical system disposed above the reticle 5 and including the optical elements, comprising the mirrors 3 and 4 and those behind the mirrors, is called a "TTL (through the lens) alignment system". The laser beam emitted from the laser 25 is converged by the lens 24 and is deflected by the mirror 23. Then, the laser beam is again deflected by the beam splitter 17 and is projected upon a pattern-bearing surface of the reticle 5 by means of the objective lens 2. The laser beam thus incident upon the pattern-bearing surface of the reticle 5 is divided into a transmitted light and a reflected light in accordance with the selective transmission characteristics of a pattern formed on the reticle 5.

The light reflected from the reticle 5 is incident again upon the objective lens 2 and, after being passed through the lens optical assembly comprising the lenses 18-20, it is focused upon the surface of the CCD photosensor 22. By this, an image of the reticle alignment mark is formed on the CCD photosensor 22.

On the other hand, the light transmitted through the reticle 5 passes through the projection optical system 6 so that it is imaged upon the wafer 8. Then, the imaged light is reflected by the wafer 8 and is imaged again upon the reticle 5. Such re-imaged light is passed through the reticle 5 and is incident upon the objective lens 2 so that, after being passed through the lenses 18-20, it is focused upon the surface of the CCD photosensor 22. By this, an image of the wafer alignment mark is formed on the CCD photosensor 22. In this manner, the information concerning the reticle alignment mark and the information concerning the wafer alignment mark are obtained, upon the CCD photosensor 22, simultaneously. Thus, any positional error therebetween is made detectable. By moving the wafer stage 9 and/or the reticle stage 28 so as to correct the positional error, the alignment of the reticle alignment mark and the wafer alignment mark can be accomplished. With such alignment process, however, it is not easy to detect the wafer-reflection light, bearing the wafer mark information, in a case where the resist material used is of the sensitizing-wavelength absorbing type such as that used in the multilayer-resist coating.

In such case, the apparatus of the present invention is operable to perform the alignment by use of a latent image. For the formation of the latent image for the automatic alignment purpose, the TTL alignment system described above is used as an illumination and exposure system to form a "photoprint" (latent image) on the wafer, more particularly the resist layer. For the formation of the latent image, a stop 31 is provided at a position which is optically conjugate with the reticle 5 surface so as to restrict the irradiation area on the reticle 5 surface. In order to form the latent image, the swingable mirrors 3 and 4 are moved to their solid-line positions, respectively. In this embodiment, the reticle 5 has two alignment marks which are formed at positions corresponding to the positions of the swingable mirrors 3 and 4. After the mirrors 3 and 4 are moved to the illustrated positions, the laser 25 is energized so as to expose the alignment mark portions of the reticle 5 and thus the alignment mark portions of the wafer 8 for a time period sufficient for the formation of latent images of the reticle alignment marks on or in the resist layer applied to the wafer 8 surface. After completion of this "exposure", the mirrors 3 and 4 are moved back to the broken-line positions as illustrated in FIG. 1.

Since the prism 7 functions simply as a parallel-surface plane plate with respect to the light of a wavelength to which the resist material has sensitivity, as described hereinbefore, the projection optical system 6 can operate in a conventional manner as an ordinary projection optical system used in an ordinary alignment and exposure apparatus.

Description will now be made to details of the alignment system provided on the wafer 8 side. The white light emitted from the light source 15 is concentrated by the reflector 16 and, after being passed through the collimator lens 14 it is projected upon the wafer 8 by means of the objective lens 10. At this time, there are existing on the wafer 8 the wafer alignment marks and the latent images of the reticle alignment marks. The light incident upon the wafer 8 is reflected thereby and is imaged upon the image pickup tube 13 by means of the objective lens 10 and the condensing lens 12. In other words, both the wafer alignment marks and the latent images (photoprints) of the reticle alignment marks are imaged upon the image pickup tube 13. Thus, upon the image pickup tube 13, the wafer alignment marks and the reticle alignment marks (latent images thereof) can be observed at the same time. Accordingly, any positional error between these alignment marks and, thus, between the reticle and the wafer can be made detectable. By moving the wafer stage 9 and/or the reticle stage 28 so as to correct the detected positional error, the alignment of the reticle alignment marks and the wafer alignment marks can be accomplished. Since the manner of calculation of the positional error is well known in the art to which the present invention pertains, description thereof will be omitted here for the simplification purpose only.

Figure 2:
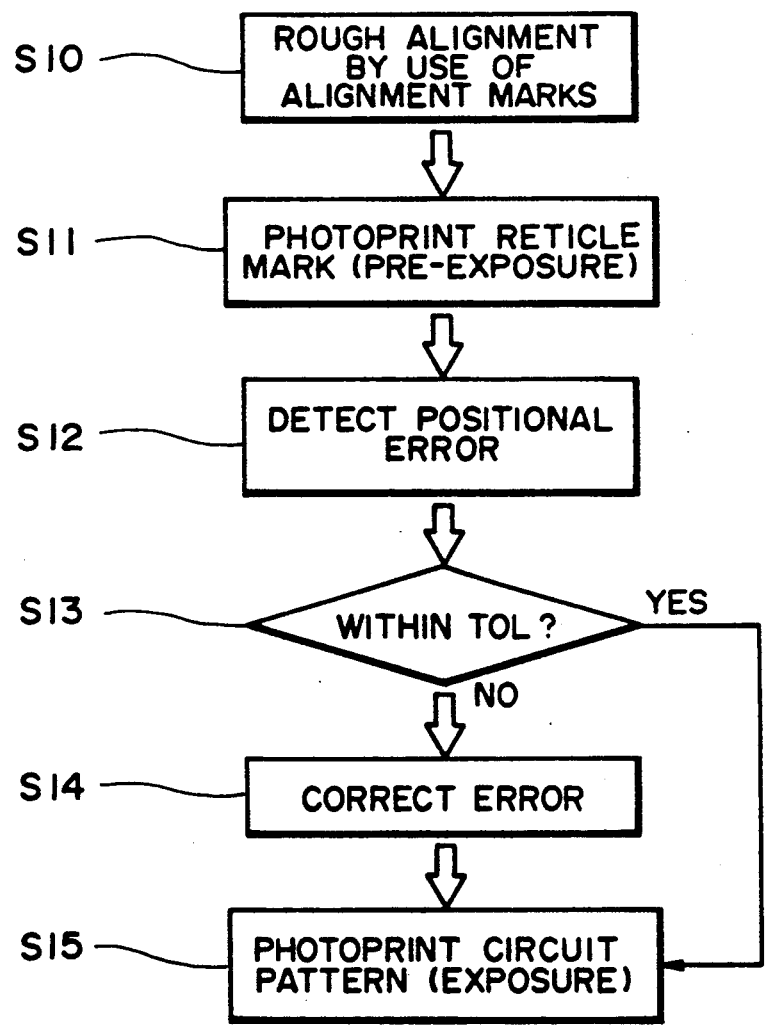
FIG. 2 is a flow chart showing the flow of a basic process made in the apparatus of FIG. 1.

Referring now to the flow chart of FIG. 2, description will be made to a basic alignment and exposure operation of the FIG. 1 apparatus, using the latent images, will be described.

First, at Step S10, the wafer 8 placed on the wafer stage 9 is roughly aligned with the reticle 5 (or mask). Typically, such rough alignment may be executed by use of the alignment marks of the reticle and the wafer. For example, the conventional TTL (through the lens) alignment method wherein the reticle alignment marks and the wafer alignment marks are observed by way of a projection lens system and wherein these marks are brought into alignment in accordance with the result of observation, may be used. Alternatively, the conventional off-axis alignment method wherein an off-axis alignment scope provided outside the optical axis of the projection lens system is used to observe the wafer alignment mark and wherein the mark is brought into alignment with a predetermined positional reference in accordance with the result of observation, may be used. After completion of the rough alignment, only the alignment mark portions of the reticle 5 are exposed to the laser beams from the laser 25 by a suitable amount. In this embodiment, each reticle alignment mark is provided by a light-transmitting region having a shape of a cross. Accordingly, the wafer 8 is exposed to the light beams passed through the reticle alignment marks. By this, latent images of the reticle alignment marks are formed on or in the resist layer of the wafer 8 (Step S11). This is called in this Specification as "pre-exposure".

Subsequently, the latent images of the reticle alignment marks, formed on or in the resist layer of the wafer 8 by the pre-exposure, as well as the wafer alignment marks are detected. Then, any positional error between the reticle alignment mark (latent image) and the wafer alignment mark is detected (Step S12). If the positional error is greater than a predetermined tolerance (Step S13), at least one of the wafer stage and the reticle stage is moved to correct the positional error (Step S14). Then the sequence goes to Step S15 wherein the shutter 16 is opened whereby the circuit pattern region of the reticle 5 is exposed to the light from the lamp 110, whereby the circuit pattern of the reticle 5 is transferred onto the wafer 8. This is herein referred to as "regular exposure". If the positional error detected at Step S12 satisfies the tolerance (Step S13), the sequence goes directly to the Step S15.

In the embodiment described hereinbefore, a dichroic prism is fixedly provided in the exposure system. This allows the exposure beam (sensitizing light) to be transmitted to the wafer substantially without loss of light. Also, it allows that an observation beam (non-sensitizing light) from the outside of the exposure system to be directed to the wafer substantially without loss of light to illuminate the wafer for observation purpose. Additionally, it allows the non-sensitizing light from the wafer to be directed outside the exposure system substantially without loss of light, for alignment detection purpose.

Moreover, the alignment system provided on the wafer side may be used not only for the detection of the latent image but also for the detection of the wafer alignment mark only. That is, it is possible to use this alignment system so as to detect the wafer alignment marks only and, in accordance with the result of detection, the wafer stage may be moved so as to displace the wafer to a desired position. In such a case, the alignment accuracy may be degraded slightly. However, the time necessary for the alignment can be reduced significantly. Further, in such case, use of the dichroic prism as in the FIG. 1 embodiment is very effective in respect to the prevention of deterioration of the alignment accuracy with the lapse of time. That is, if a swingable mirror such as at 27 in FIG. 6A arrangement is used, there is a possibility that the optical axis of the alignment detecting optical system deviates as a result of the degradation in the positioning accuracy of such movable mirror, caused as a product of use of the apparatus for a long time period. The use of a dichroic prism as in the present embodiment effectively avoids such possibility.

Figure 3:
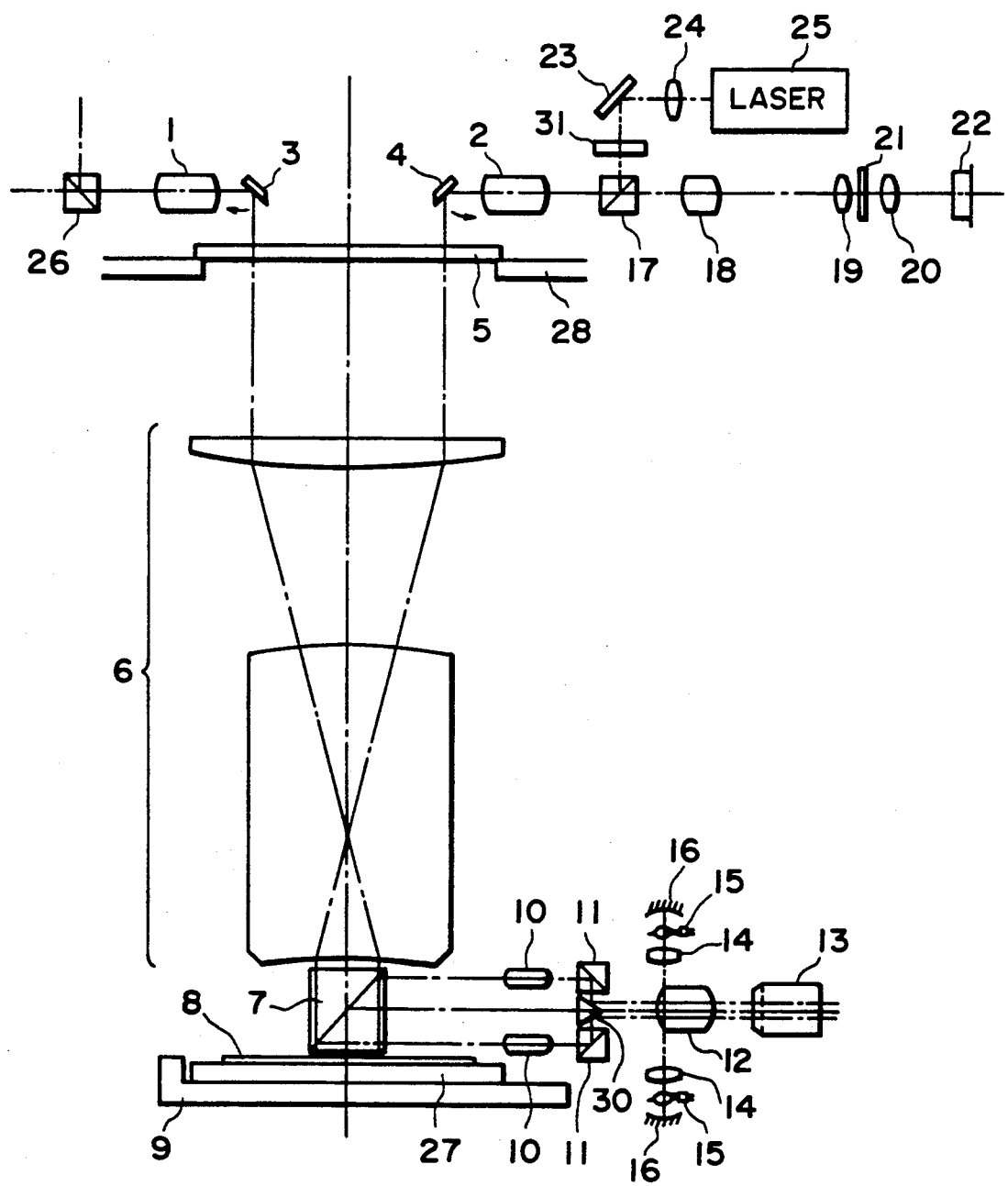
FIG. 3 is a fragmentary and schematic view of an alignment and exposure apparatus according to another embodiment of the present invention.

In the present embodiment, the alignment system provided on the wafer side includes a single objective lens having a relatively wide angle of view, as described hereinbefore. If, however, use of a smaller lens is desired, the objective lens may be provided by plural discrete objective lenses. In such case, the objective lenses may be disposed so as to illuminate different alignment marks, respectively, and to receive lights reflected from the different alignment marks. Such example is illustrated in FIG. 3. In the arrangement shown in FIG. 3, denoted at numeral 30 is a prism which is effective to combine the images as formed by two objective lenses 10—10. In this embodiment, only the X-Y-Z stage 9 provided on the wafer 8 side is moved to correct the positional error between the reticle alignment marks and the wafer alignment marks and the wafer alignment marks. However, the error-correcting movement may be made at the reticle 5 side. To displace the reticle for the error-correction purpose is advantageous because it allows more precise adjustment of the positional relation between the reticle and the wafer, as is known in the art.

In each of the embodiments illustrated in FIGS. 1 and 3, the mirrors 3 and 4 of the TTL alignment system have to be retracted at the time of circuit pattern exposure. However, where beam splitters are used in place of these mirrors, such retracting movement of the mirrors may be omitted. This is preferable because it allows an increased throughput.

The alignment and exposure operation described with reference to FIG. 2 may be executed only for the first shot area on the wafer. That is, for the first shot area only, the alignment may be executed by using the latent images of the reticle alignment marks. Then, the positions of the wafer alignment marks, upon the image pickup tube, as assumed at the time of completion of the alignment may be stored in suitable memory means. On the other hand, for each of the remaining shot areas on the wafer, the alignment may be executed without using the latent images. That is, in such case, for the alignment purpose, no latent image of any reticle alignment mark is formed on the wafer. In place thereof, the wafer position may be adjusted so that the positions of the wafer alignment marks of the second shot area, for example, as observed upon the image pickup surface of the image pickup tube are brought into coincidence with the positions, as having been stored, of the wafer alignment marks of the first shot area with respect to the image pickup surface of the image pickup tube. This alignment method assures an increased throughput of the apparatus. It is to be noted that in this case the reticle is held fixed after the alignment with respect to the first shot area is once completed.

In the embodiment described with reference to FIG. 1, a relatively large size objective lens such as at 10 may be replaced by a single smaller size objective lens such as illustrated in FIG. 3, if it is not easy to use a large lens element in view of the space factor. In such case, for the alignment purpose, the position of the single smaller objective lens relative to the wafer alignment marks may be changed, during the alignment operation, so as to allow detection of the two wafer alignment marks. The displacement of the objective lens may be made in accordance with the positional information concerning the positions of the wafer alignment marks with respect to the wafer as a whole, the information being preparatorily stored in suitable memory means. This is preferable because at least two alignment marks should be observed to detect the misalignment in each of the X, Y and $\theta$ (rotational) directions. Of course, in the above-described case, the latent images of the reticle alignment marks are formed in the neighborhood of the two wafer alignment marks, respectively.

Figure 4:
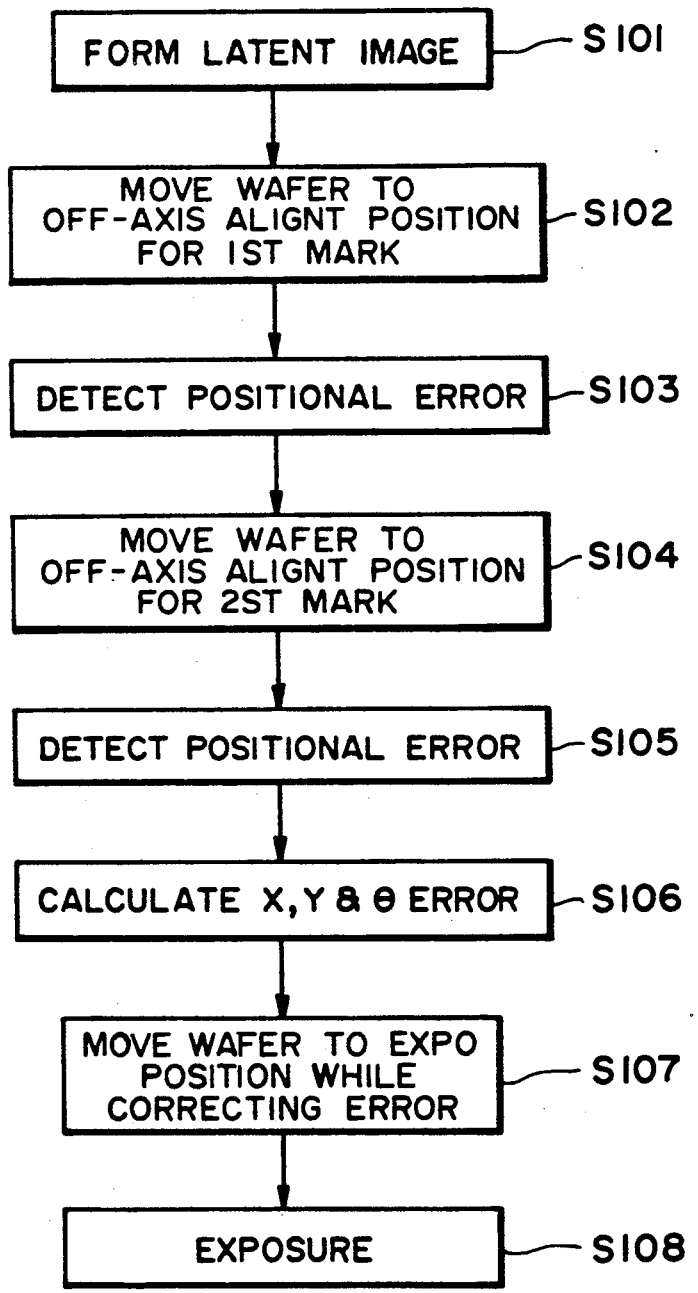
FIGS. 4 and 5 are flow charts showing examples of alignment and exposure operations made in an alignment and exposure apparatus according to a further embodiment of the present invention, wherein a wafer-side alignment system includes an objective lens having a small field size.
Figure 5:
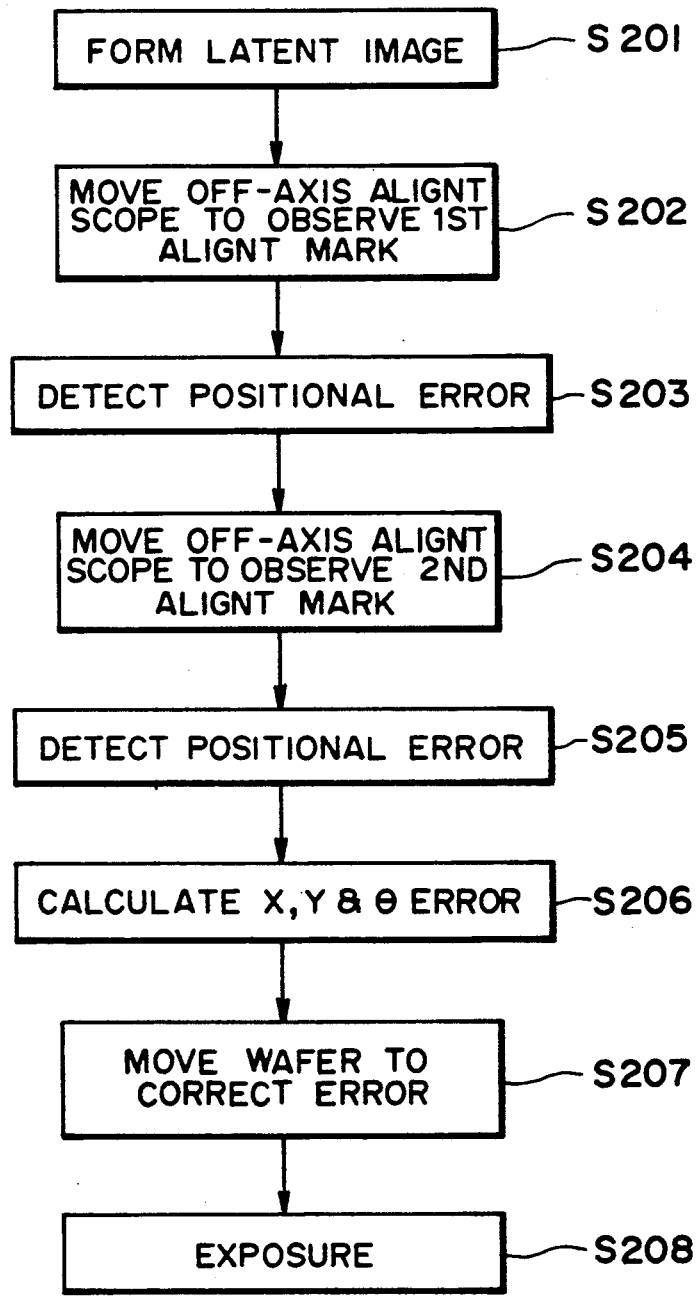

The relative displacement of the objective lens and the wafer alignment marks may be made either by moving the wafer with the objective lens being fixedly secured, or by moving the objective lens with the wafer being held fixedly. The flow charts of FIGS. 4 and 5 show such two cases. More particularly, the flow chart of FIG. 4 corresponds to a case where the off-axis microscope system is made fixed. At Step S101, the latent images of the reticle alignment marks are formed on the wafer. Then, at Step S102, the wafer stage is moved to move the wafer so as to allow that the first one of the wafer alignment marks (and corresponding one of the latent images) is observed by the off-axis microscope alignment optical system. Then, at Step S103, any positional error of the first wafer alignment mark is detected. Subsequently, at Step S104, the wafer stage is moved to move the wafer so as to allow that the second one of the wafer alignment marks (and the corresponding one of the latent images of the reticle alignment marks) is observed through the off-axis microscope alignment optical system. Similarly, at Step S105, the positional error of the second wafer alignment mark is detected and, thereafter, the misalignment (positional error in respect to the X, Y and $\theta$ directions) is calculated at Step S106. Then, the wafer stage is moved to move the wafer to the exposure position while correcting the misalignment (Step S107). Finally, the exposure is effected (Step S108).

On the other hand, the flow chart of FIG. 5 corresponds to a case where the objective lens is moved. Except for moving the off-axis alignment microscope optical system, the process made in accordance with the flow chart of FIG. 5 is the same a that of the FIG. 4 flow chart.

In accordance with the present invention, as has hitherto been described, two objects such as a reticle and a wafer can be aligned very precisely and accurately with least systematic errors and substantially without being affected by the process adopted. Also, the alignment can be made without decreasing the throughput.

While the invention has been described with reference to the structures disclosed herein, it is not confined to the details set forth and this application is intended to cover such modifications or changes as may come within the purposes of the improvements or the scope of the following claims.

What is claimed is:

1. A mark detecting device usable in an alignment and exposure apparatus for aligning an alignment mark of a mask with an alignment mark of a wafer and for exposing a resist layer provided on the surface of the wafer to a pattern of the mask with radiation, said device comprising:

detecting means for detecting light from the wafer, said detecting means including (i) photodetecting means for detecting light and (ii) wavelength selecting means disposed in a path of light from the wafer to said photodetecting means, so as to allow introduction of light of a predetermined wavelength into said path of light from outside said path of light to illuminate the wafer; and latent image forming means for forming a latent image of the alignment mark of the mask in a portion of the resist layer provided on the surface of the wafer, said latent image forming means being arranged, for the formation of the latent image, to direct to the wafer the light of said predetermined wavelength from the outside of said path of light and by way of the mask and said wavelength selecting means;

wherein said photodetecting means is effective to detect the light from the wafer to detect the alignment mark of the wafer and the latent image of the alignment mark of the mask.

2. A device according to claim 1, wherein said wavelength selecting means comprises a dichroic prism.

3. A device according to claim 2, wherein said dichroic prism is arranged to transmit the light of said predetermined wavelength.

4. A device according to claim 3, wherein said detecting means includes a light source for irradiating the surface of the wafer with a white light.

5. A device according to claim 4, wherein said light source is arranged to illuminate said dichroic prism so that the wafer is illuminated with the light reflected by said dichroic prism.

6. A device according to claim 5, wherein said photodetecting means is adapted to detect the light from the alignment mark of the wafer and the latent image of the alignment mark of the mask, as illuminated by said light source, after being reflected by said dichroic prism.

7. A device according to claim 6, wherein said latent image forming means includes exposing means for exposing, to the pattern of the mask, the resist layer provided on the surface of the wafer.

8. A device according to claim 7, wherein said latent image forming means includes alight source adapted to form the latent image of the alignment mark and to expose the wafer to the pattern of the mask.

9. A device according to claim 8, wherein said latent image forming means includes variable setting means for variably setting an illumination area on the resist layer, which area is to be illuminated by said light source, said variable setting means being arranged to set an illumination area for the formation of the latent image, which are is different from an illumination area to be set for exposure of the wafer to the pattern of the mask.

10. A mark detecting device usable in an alignment and exposure apparatus for aligning an alignment mark of a mask with an alignment mark of a wafer and for exposing a resist layer provided on the surface of the wafer to a pattern of the mask with radiation, said device comprising:
- illumination means for illuminating the alignment mark of the wafer, said illumination means including (i) an illumination source for producing an illuminating light and (ii) wavelength selecting means disposed in a path of the illuminating light from said illumination source to the alignment mark, so as to allow introduction of light of a predetermined wavelength into said path of light, from outside said path of light;
- latent image forming means for forming a latent image of the alignment mark of the mask in a portion of the resist layer provided on the surface of the wafer, said latent image forming means being arranged, for the formation of the latent image to direct to the wafer the light of said predetermined wavelength from the outside of said path of light and by way of said wavelength selecting means; and
- detecting means for detecting light from the alignment mark of the wafer and the latent image of the alignment mark of the mask, as illuminated by said illumination means.

11. A device according to claim 10, wherein said wavelength selecting means comprises a dichroic prism.

12. A device according to claim 11, wherein said dichroic prism is arranged to transmit the light of said predetermined wavelength.

13. A device according to claim 12, wherein said detecting means includes a light source for irradiating the surface of the wafer with a white light.

14. A device according to claim 12, wherein said dichroic prism is arranged to transmit the light used for photolithographically transferring the pattern of the mask onto the resist layer provided on the surface of the wafer.

15. An apparatus for transferring a pattern of a mask onto a resist layer provided on the surface of a wafer, said apparatus comprising:
- a light source for producing a light to be used for transferring the pattern of the mask onto the resist layer provided on the surface of the wafer; and
- exposing means for forming an optical path usable to expose the mask with the light from said light source and to illuminate the wafer with light transmitted through the mask, said exposing means being operable to form, on a portion of the resist layer of the wafer, a latent image of an alignment mark provided on the mask, said exposing means including wavelength selecting means for branching from said optical path, a light from the wafer and having a predetermined wavelength different from that of the light from said light source so as to allow observation of an alignment mark provided on the wafer and the latent image of the alignment mark of the mask as formed on the resist layer of the wafer.

16. An apparatus according to claim 15, further comprising means for detecting the light branched by said branching means.

17. An apparatus according to claim 16, further comprising means for illuminating the wafer with the light having said different wavelength.

18. An apparatus according to claim 17, wherein said branching means comprises a dichroic prism.

19. An apparatus according to claim 18, wherein said detecting means includes mark detecting means for detecting an alignment mark provided on the wafer and a latent image, formed on a portion of the resist layer, of an alignment mark provided on the mask.

20. A mark detecting device usable in an alignment and exposure apparatus for aligning an alignment mark of a mask with an alignment mark of a wafer and for exposing, to a pattern of the mask, a resist layer provided on the surface of the wafer, said device comprising:
- a first alignment optical system for irradiating an upper surface of the wafer with a first alignment light and for detecting light from the upper surface of the wafer; and
- a second alignment optical system for illuminating, simultaneously, the alignment mark of the mask and the alignment mark of the wafer with a second alignment light, and for detecting lights from the alignment marks of the mask and the wafer, said second alignment optical system including a light source adapted to illuminate the alignment marks of the mask and the wafer with the second alignment light and to form a latent image of the alignment mark of the mask in a portion of the resist layer provided on the surface of the wafer; and
- light selecting means fixedly disposed between the mask and the wafer, for substantially transmitting one of the first and second alignment lights and for substantially reflecting the other of the first and second alignment lights.

21. A device according to claim 20, wherein the first alignment light has a wavelength substantially the same as that of the light to be used for exposing, to the pattern of the mask, the resist layer provided on the surface of the wafer.

22. A projection exposure apparatus, comprising:
- a first stage for supporting a photomask;
- a second stage for supporting a wafer having a surface resist layer;
- illumination means for irradiating the photomask with a light having a predetermined wavelength so that a pattern formed on the photomask is transferred onto the resist layer of the wafer;
- a projection lens system provided between said first and second stages and being operable with said illumination means so that the pattern of the photomask is imaged on the resist layer of the wafer;
- a dichroic beam splitter provided between said projection lens system and said second stage, said dichroic beam splitter being operable to transmit said light having a predetermined wavelength but to reflect a different light having a wavelength different from that of said light having a predetermined wavelength;
- a light supplying means for supplying said different light to illuminate the wafer with the aid of the reflection by said dichroic beam splitter; and
- observation means for receiving light from the wafer and reflected by said dichroic beam splitter to observe a mark provided on the wafer, when the wafer is illuminated by said different light, wherein said illumination means is adapted to illuminate an alignment mark provided on the photomask so that a latent image of the alignment mark of the photomask is formed on the resist layer of the wafer and wherein said observation means is adapted to observe the alignment mark on the wafer and the latent image of the alignment mark of the photomask as formed on the resist layer of the wafer.

23. An apparatus according to claim 22, further comprising means for adjusting a relative position of the photomask and the wafer, on the basis of the positional relationship between the alignment mark of the wafer and the latent image of the photomask, formed in a portion of the wafer, as detected through the observation by said observation means.

24. A method, usable in a projection exposure apparatus for projecting a pattern of a photomask upon a wafer through a projection optical system, for detecting a position of an image of a mark of the photomask projected upon the wafer through the projection optical system, said method comprising the steps of:
   providing a dichroic film at a position between the photomask and the wafer;
   irradiating the photomask with light of a first wavelength so that, through the projection optical system and the dichroic film, an image of the mark of the photomask is projected upon the wafer to form a latent image of the mark in a portion of a resist surface layer of the wafer;
   directing to the dichroic film light of a second wavelength different from the first wavelength so that the wafer is irradiated with the light of the second wavelength from the dichroic film; and
   detecting light reflected from the wafer being irradiated, and passing through the dichroic film to detect the position of the latent image of the mark as formed in the portion of the resist surface layer of the wafer.

25. A method according to claim 24, wherein the dichroic film is formed in a portion of a prism element which is disposed between the projection optical system and the wafer.

26. A method according to claim 24, wherein the light of the first wavelength is supplied from a laser.

27. A method according to claim 24, wherein the wafer is provided with an alignment mark and wherein detection of the light from the wafer is effective to detect the latent image of the mark of the photomask and the alignment mark of the wafer.

28. A method according to claim 25, wherein the dichroic film has transmissibility to the light of the first wavelength and reflectivity to the light of the second wavelength.

29. A method, usable in a projection exposure apparatus for projecting a pattern of an original upon a workpiece through a projection optical system, for detecting a latent image of a mark on the original, as formed in a portion of a resist layer provided on the workpiece, said method comprising the steps of:
   providing an optical member having a dichroic film a a position between the original and the workpiece and in a path of light to be projected by the projection optical system;
   forming a latent image of the mark of the original in a portion of the resist layer on the workpiece, said latent image forming step including projecting an image of the mark of the original onto the workpiece, through the projection optical system and through the dichroic film of the optical member by use of a first beam having a first wavelength;
   directing a second beam having a second wavelength, different from the first wavelength, to the optical member so that the workpiece is irradiated with the second beam from the optical member; and
   detecting the latent image on the workpiece, irradiated by the second beam by receiving the second beam reflected from the workpiece.

30. A method according to claim 29, wherein the dichroic film is formed in a portion of a prism element which forms said optical member and which is disposed with an inclination between the projection optical system and the workpiece.

31. A method according to claim 29, wherein the first beam is supplied from a laser and the second beam is supplied from a white light source.

32. A method according to claim 29, wherein the workpiece is a semiconductor wafer having a wafer alignment mark and the original is a photomask having a mask alignment mark, which is said mark on said original, both for use in the manufacture of microcircuit devices, and wherein detection of the second beam from the wafer is used to detect both the latent image of the mask alignment mark on the photomask and the wafer alignment mark on the wafer, in order to detect the relative position of the photomask and the wafer.

33. A method according to claim 30, wherein the dichroic film is disposed with an inclination with respect to an optical axis of the projection optical system and has sufficient transmissibility to the first beam and sufficient reflectivity to the second beam.

34. A method according to claim 32, wherein an image pickup tube is used to observe the latent image of the mask alignment mark on the photomask formed on the wafer and the wafer alignment mark on the wafer, both being irradiated with the second beam.

* * * * *

UNITED STATES PATENT AND TRADEMARK OFFICE
CERTIFICATE OF CORRECTION

PATENT NO. : 5,148,214
DATED : September 15, 1992
INVENTOR(S) : MASAKATSU OHTA, ET AL.

It is certified that error appears in the above-identified patent and that said Letters Patent is hereby corrected as shown below:

COLUMN 4

Line 48, "the" should read --The--.

COLUMN 11

Line 61, "purpose." should read --purposes.--.
Line 65, "purpose." should read --purposes.--.

COLUMN 12

Line 1, "only." should be deleted.
Line 35, "marks and the" (second occurrence) should read --marks.--.
Line 36, "wafer alignment marks." should be deleted.

UNITED STATES PATENT AND TRADEMARK OFFICE
CERTIFICATE OF CORRECTION

PATENT NO. : 5,148,214

DATED : September 15, 1992

INVENTOR(S) : MASAKATSU OHTA, ET AL.

It is certified that error appears in the above-identified patent and that said Letters Patent is hereby corrected as shown below:

<u>COLUMN 14</u>

Line 53, "alight" should read --a light--.
    Line 62, "are" should read --area--.

<u>COLUMN 18</u>

Line 4, "a" (second occurrence) should read --at--.

Signed and Sealed this

Twelfth Day of October, 1993

Attest:

BRUCE LEHMAN

*Attesting Officer*    *Commissioner of Patents and Trademarks*